United States Patent
Yang et al.

(10) Patent No.: US 10,921,062 B2
(45) Date of Patent: Feb. 16, 2021

(54) COOLING FAN AND HEAT DISSIPATING MODULE INCLUDING THE SAME

(71) Applicants: INVENTEC (PUDONG) TECHNOLOGY CORPORATION, Shanghai (CN); INVENTEC CORPORATION, Taipei (TW)

(72) Inventors: Chih-Kai Yang, Taipei (TW); Yi-Lun Cheng, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/436,725

(22) Filed: Jun. 10, 2019

(65) Prior Publication Data
US 2020/0378688 A1 Dec. 3, 2020

(30) Foreign Application Priority Data
May 28, 2019 (CN) .......................... 2019 1 0451591

(51) Int. Cl.
*F28D 15/02* (2006.01)
*G06F 1/20* (2006.01)
(Continued)

(52) U.S. Cl.
CPC ........... *F28D 15/0275* (2013.01); *F04D 1/04* (2013.01); *F04D 15/0066* (2013.01); *F04D 29/002* (2013.01); *F04D 29/04* (2013.01); *F04D 29/281* (2013.01); *F04D 29/441* (2013.01); *F04D 29/584* (2013.01); *G06F 1/20* (2013.01);
(Continued)

(58) Field of Classification Search
CPC ...... F04D 17/16; F04D 29/162; F04D 29/083; F04D 29/4226; F04D 29/584; G06F 1/203; G06F 1/20; G06F 2200/201; H01L 23/467; H01L 23/427; H05K 7/20145; H05K 7/20172; H05K 7/20336; H05K 7/20563; H05K 7/20727
See application file for complete search history.

(56) References Cited

U.S. PATENT DOCUMENTS 5,000,254 A * 3/1991 Williams ................ F28F 13/02
165/109.1
5,445,215 A * 8/1995 Herbert ................ F04D 29/547
165/125

(Continued)

FOREIGN PATENT DOCUMENTS

JP 59-28096 A * 2/1984 ........... F04D 29/162

OTHER PUBLICATIONS

English machine tanslation of abstract of JP-59-28096, Jul. 19, 2020.*

*Primary Examiner* — Christopher Verdier
(74) *Attorney, Agent, or Firm* — Maschoff Brennan (57) ABSTRACT

A cooling fan includes a base, a tube, a bearing, a stator, a rotor, and fan blades. The base includes a base protrusion. Each of the fan blades includes a first notch. When the cooling fan is working, the base protrusion passes through the first notch on each of the fan blades. The base protrusion and the first notch not only increase the heat exchange area of the base but break the thermal boundary layer on the base repeatedly to improve the heat dissipating effect when the cooling fan is working.

9 Claims, 7 Drawing Sheets (51) Int. Cl.
*H05K 7/20* (2006.01)
*F04D 1/04* (2006.01)
*F04D 29/44* (2006.01)
*F04D 29/00* (2006.01)
*F04D 29/04* (2006.01)
*F04D 29/28* (2006.01)
*F04D 15/00* (2006.01)
*H01L 23/427* (2006.01)
*F04D 29/58* (2006.01)
*H01L 23/467* (2006.01)
*F04D 29/42* (2006.01)

(52) U.S. Cl.
CPC ............ *G06F 1/203* (2013.01); *H01L 23/427* (2013.01); *H01L 23/467* (2013.01); *H05K 7/20145* (2013.01); *H05K 7/20336* (2013.01); *F04D 29/4226* (2013.01); *G06F 2200/201* (2013.01); *H05K 7/20172* (2013.01)

(56) References Cited

U.S. PATENT DOCUMENTS

| | | | | |
|---|---|---|---|---|
| 7,381,027 | B2 * | 6/2008 | Kaneko | F04D 29/282 415/102 |
| 2006/0222491 | A1 * | 10/2006 | Shimada | F04D 29/162 415/206 |
| 2007/0154308 | A1 * | 7/2007 | Yang | F04D 29/547 415/220 |
| 2010/0247344 | A1 * | 9/2010 | Yang | F04D 29/384 417/410.1 |
| 2014/0290918 | A1 * | 10/2014 | Chen | F28D 15/0233 165/121 |

* cited by examiner

COOLING FAN AND HEAT DISSIPATING MODULE INCLUDING THE SAME

CROSS-REFERENCE TO RELATED APPLICATIONS

This non-provisional application claims priority under 35 U.S.C. § 119(a) on Patent Application No(s). 201910451591.7 filed in China on May 28, 2019, the entire contents of which are hereby incorporated by reference.

BACKGROUND

1. Technical Field

This disclosure relates to a cooling fan and a heat dissipating module including the cooling fan.

2. Related Art

As the advancement of technology, many kinds of electronic products have been developed. During the operation of these electronic products, a large amount of heat is generated and accumulated therein. If the heat is not dissipated in time, the raising temperature caused by the excessive heat may affect the normal operation of these electronic products, reduce their life and even cause malfunction. Accordingly, in order to maintain the normal operation of the electronic products, it is necessary to install heat dissipating components in the electronic products. The common heat dissipating components are such as heat pipes, heat fins, fans, and the like.

SUMMARY

According to one or more embodiment of this disclosure, a cooling fan comprises a base, a tube, a bearing, a stator, a rotor, and a plurality of fan blades. The base has a base protrusion. The tube is fixed to the base and surrounded by the base protrusion. The bearing is disposed in the tube. The stator is fixed to the base. The rotor is pivoted to the bearing. The plurality of fan blades are connected to the rotor. Each of the fan blades has a first notch. The base protrusion passes through the first notch of each of the fan blades when the rotor is rotating.

According to one or more embodiment of this disclosure, a heat dissipating module comprises a cooling fan described above and a heat pipe. The heat pipe is connected to the base of the cooling fan.

BRIEF DESCRIPTION OF THE DRAWINGS

The present disclosure will become better understood from the detailed description given hereinbelow and the accompanying drawings which are given by way of illustration only and thus are not intended to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
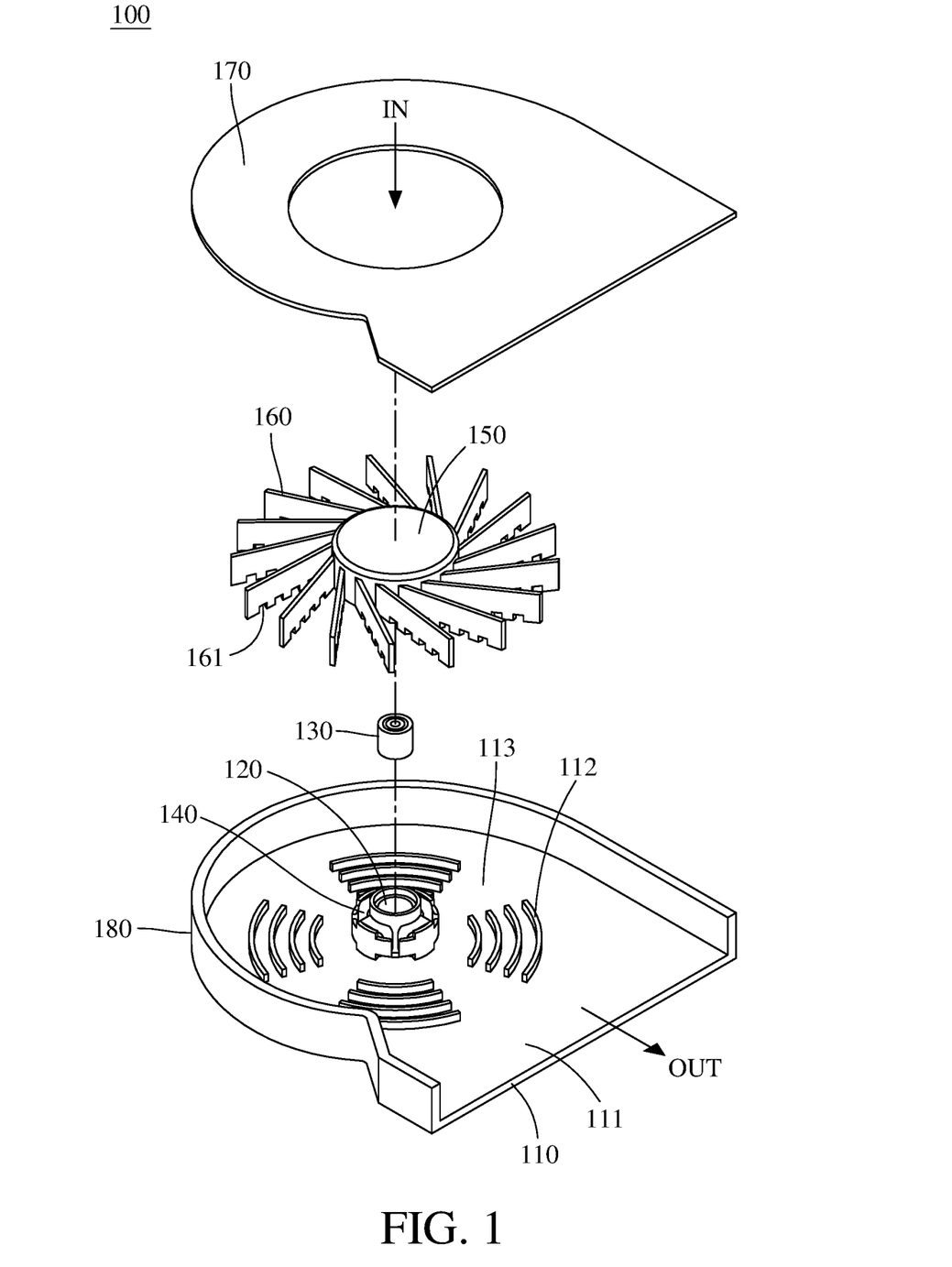
FIG. 1 is an exploded view of the cooling fan according to a first embodiment of the present disclosure.
Figure 2:
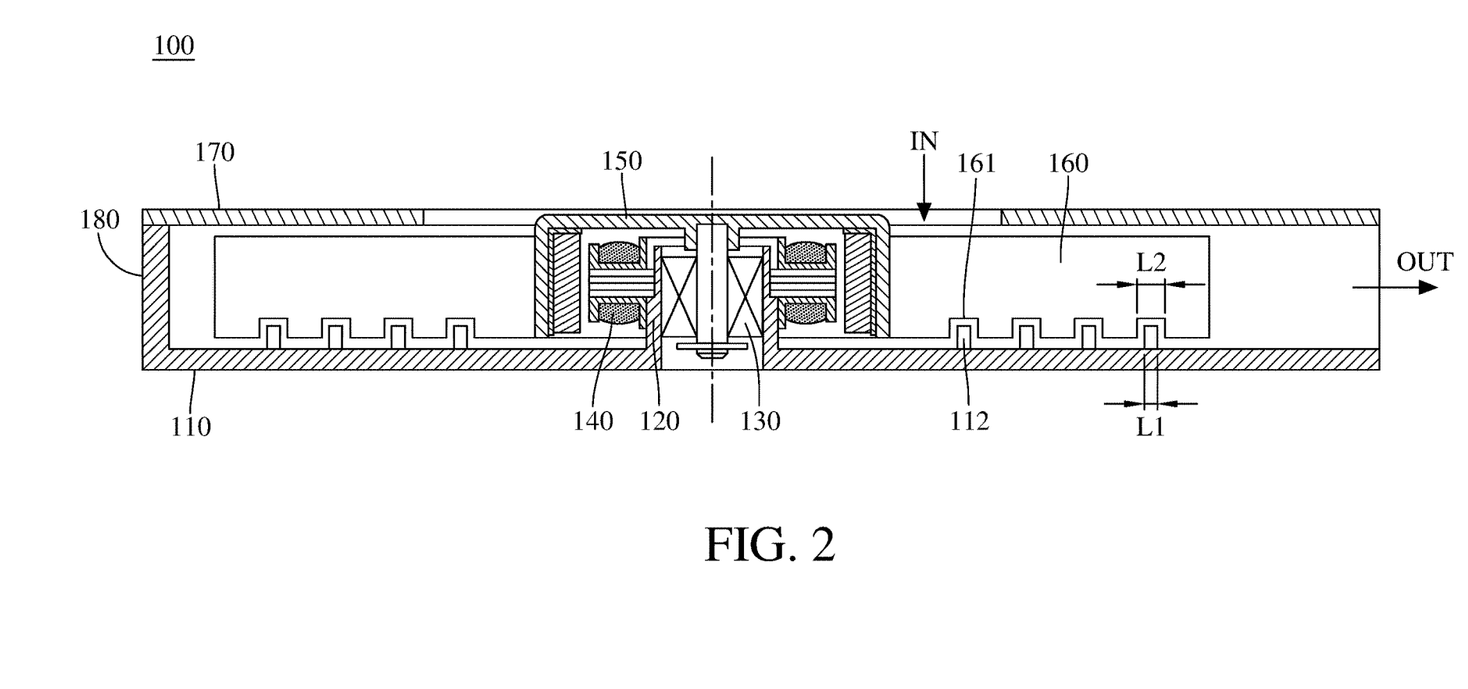
FIG. 2 is a cross-sectional view of the cooling fan according to the first embodiment of the present disclosure.

First, the cooling fan 100 according to the first embodiment of the present disclosure will be described below. Please refer to FIG. 1 and FIG. 2. FIG. 1 is an exploded view of the cooling fan according to a first embodiment of the present disclosure. FIG. 2 is a cross-sectional view of the cooling fan according to the first embodiment of the present disclosure. The cooling fan 100 includes a base 110, a tube 120, a bearing 130, a stator 140, a rotor 150, a plurality of fan blades 160, a top board 170, and a wall 180, and the cooling fan 100 has an inlet IN and an outlet OUT.

The base 110 has a bearing surface 111 and four base protrusions 112. The base protrusions 112 are disposed on the bearing surface 111. The tube 120 is fixed to the bearing surface 111 and surrounded by the base protrusions 112. Each of the base protrusions 112 have four base passages 113. The tube 120 is exposed in the base passages 113. In the first embodiment, the number of the base protrusions 112 is four, and the number of the base passages 113 at each base protrusion 112 is four, but the present disclosure is not limited thereto. The base 110 may be made of materials with high thermal conductivity, such as metal. When the bearing surface 111 of the base 110 serves as a heat exchange surface, the heat exchange area of the base 110 is increased by the base protrusions 112 so as to improve the heat exchange efficiency of the cooling fan 100.

The bearing 130 is disposed in the tube 120. The stator 140 is fixed on the bearing surface 111 of the base 110 by the tube 120 and surrounds the tube 120. In other words, the stator 140 is surrounding and fixed to the tube 120 standing on the bearing surface 111 of the base 110. The rotor 150 is pivoted to the bearing 130. The fan blades 160 are connected to the rotor 150. The stator 140 and the rotor 150 drive the fan blades 160 to rotate. In other embodiments, the stator may be directly fixed to the bearing surface of the base.

The fan blades 160 have first notches 161. The first notches 161 are located on the side of the fan blades 160 facing the base 110. In this embodiment, the number of the first notches 161 on each of the fan blades 160 is four. When the rotor 150 is rotating, the base protrusions 112 pass through the first notches 161 of each of the fan blades 160, respectively. Similarly, the parts between the first notches 161 of each of the fan blades 160 pass through the spaces between the base protrusions 112, respectively. The base protrusion 112 has a first width L1, and the first notch 161 has a second width L2. The first width L1 is less than the second width L2. Therefore, when the rotor 150 is rotating, the base protrusions 112 on the fan blades 160 can pass through the first notches 161 smoothly and not interfere with the first notches 161. In this embodiment, the cross-section of the base protrusion 112 and the first notch 161 may be a rectangle shape, but the present disclosure is not limited thereto. In other embodiments, the cross-section of the base protrusion or the first notch may be a rectangle, a triangle, a curved shape or other shapes, and the cross-section of the base protrusion and the first notch may have different shapes as long as the base protrusions may pass through the first notches smoothly. Through the first notches 161 of the fan blades 160 and the base protrusions 112 of the base 110, the flow perturbation, such as eddy or turbulence, can be generated to break the thermal boundary layer formed on the base 110 when the rotor 150 is rotating. Thus, the heat transfer and the heat dissipating efficiency are improved. In addition, the base passages 113 of the base protrusions 112 serves as exits for the air flow with higher temperature accumulated between the base protrusions 112 to flow out.

The top board 170 is opposite to the base 110, and the wall 180 is located between and connected to the top board 170 and the base 110. The top board 170, the wall 180 and the base 110 form a case, and the stator 140, the rotor 150 and the fan blades 160 are located in the case. The inlet IN is located on the top board 170 for introducing the air flow into the case from the outside of the case. In another embodiment, the inlet IN may be located on the base. In the other embodiment, the inlets IN may be respectively located on the top board and the base. The outlet OUT is located on the wall 180 for discharging the air flow with higher temperature. At least one base passage 113 of the base protrusions 112 is located between the tube 120 and the outlet OUT, that is, beside the outlet OUT. This configuration can help the fan blades 160 rapidly discharging the air flow with higher temperature accumulated between the base protrusions 112 to the outside of the cooling fan 100. In this embodiment, the stator 140, the rotor 150 and the fan blades 160 are located between the top board 170, the wall 180 and the base 110, and the outlet OUT is located at the wall 180, but the present disclosure is not limited thereto. In other embodiments, the cooling fan, such as an axial-flow fan, has the inlet and the outlet located on the top board and the base respectively.

Figure 3:
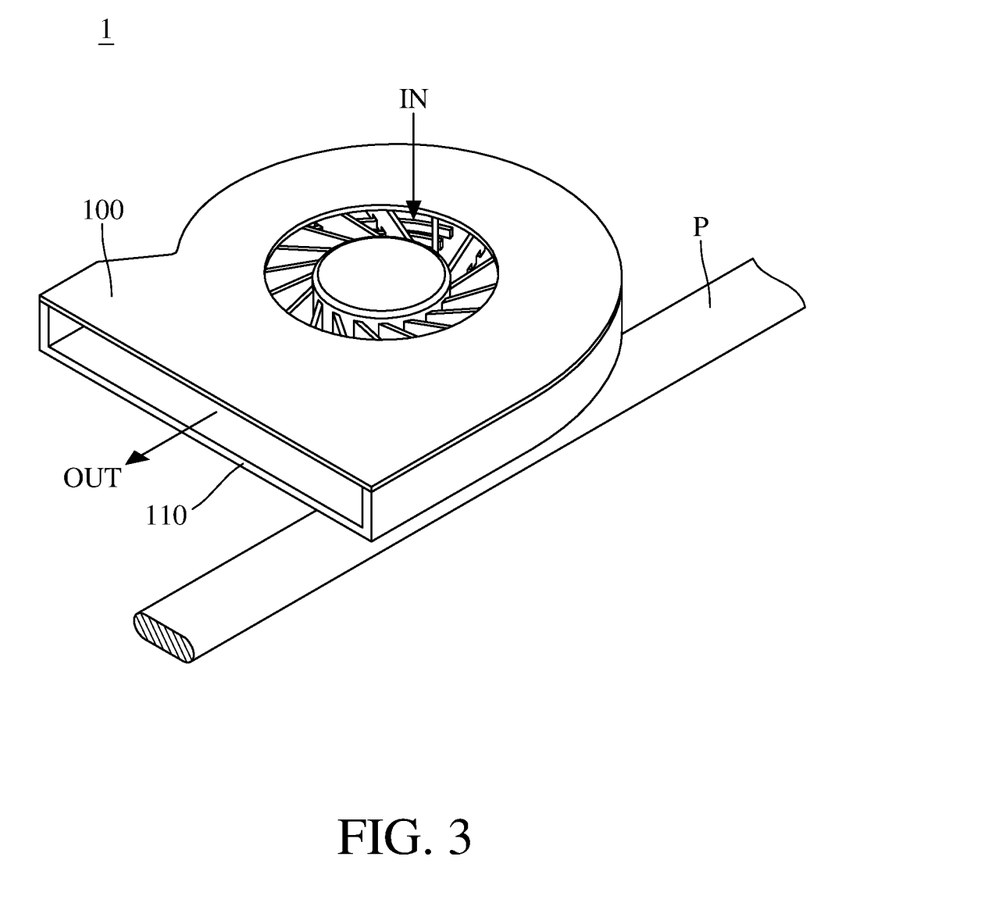
FIG. 3 is a perspective view of the heat dissipating module including the cooling fan according to the first embodiment of the present disclosure.

Then, the heat dissipating module 1 including the cooling fan 100 according to the first embodiment of the present disclosure will be described below. Please refer to FIG. 3. FIG. 3 is a perspective view of the heat dissipating module including the cooling fan according to the first embodiment of the present disclosure. The heat dissipating module 1 includes the cooling fan 100 according to the first embodiment described above and a heat pipe P. The heat pipe P is in contact with the base 110 and transfers heat to the cooling fan 100 for heat dissipation. The heat dissipating module 1 may be applied to any electronic products requiring heat dissipators, such as a notebook computer, a desktop computer, and the like. In this embodiment, the cooling fan 100 according to the first embodiment is used in the heat dissipating module 1 to dissipate heat, but the present disclosure is not limited thereto. The cooling fan according to other embodiments of the present disclosure may also be used in the heat dissipating module to dissipate heat.

The following is the introduction of the heat transfer pathway in the heat dissipating module 1 with the cooling fan 100 according to the first embodiment of the present disclosure. The heat pipe P is in contact with a heat source or other heat conductive component, and the heat is transferred to the base 110 by the heat pipe P. The base 110, the top board 170 and the wall 180 may be made of materials with good thermal conductivity, and thus the base 110, the top board 170 and the wall 180 connected to each other may transfer heat and serve as heat exchanging components for exchanging heat. The heat exchange area of the base 110 is increased by the base protrusions 112. When the cooling fan 100 is working, the air flow is introduced from the inlet IN. The air flow passes through the base 110 to transfer heat, and then the heated air flow is discharged by the outlet OUT. In addition, when the cooling fan 100 is working, the base protrusions 112 pass through the first notches 161 of each of the fan blades 160, respectively. Similarly, the parts between the first notches 161 of each of the fan blades 160 pass through the spaces between the base protrusions 112, respectively. Therefore, the flow perturbation generated by the rotating fan blades 160 breaks the thermal boundary layer formed on the surface of the base 110 repeatedly so as to improve the heat dissipating effect.

Figure 4:
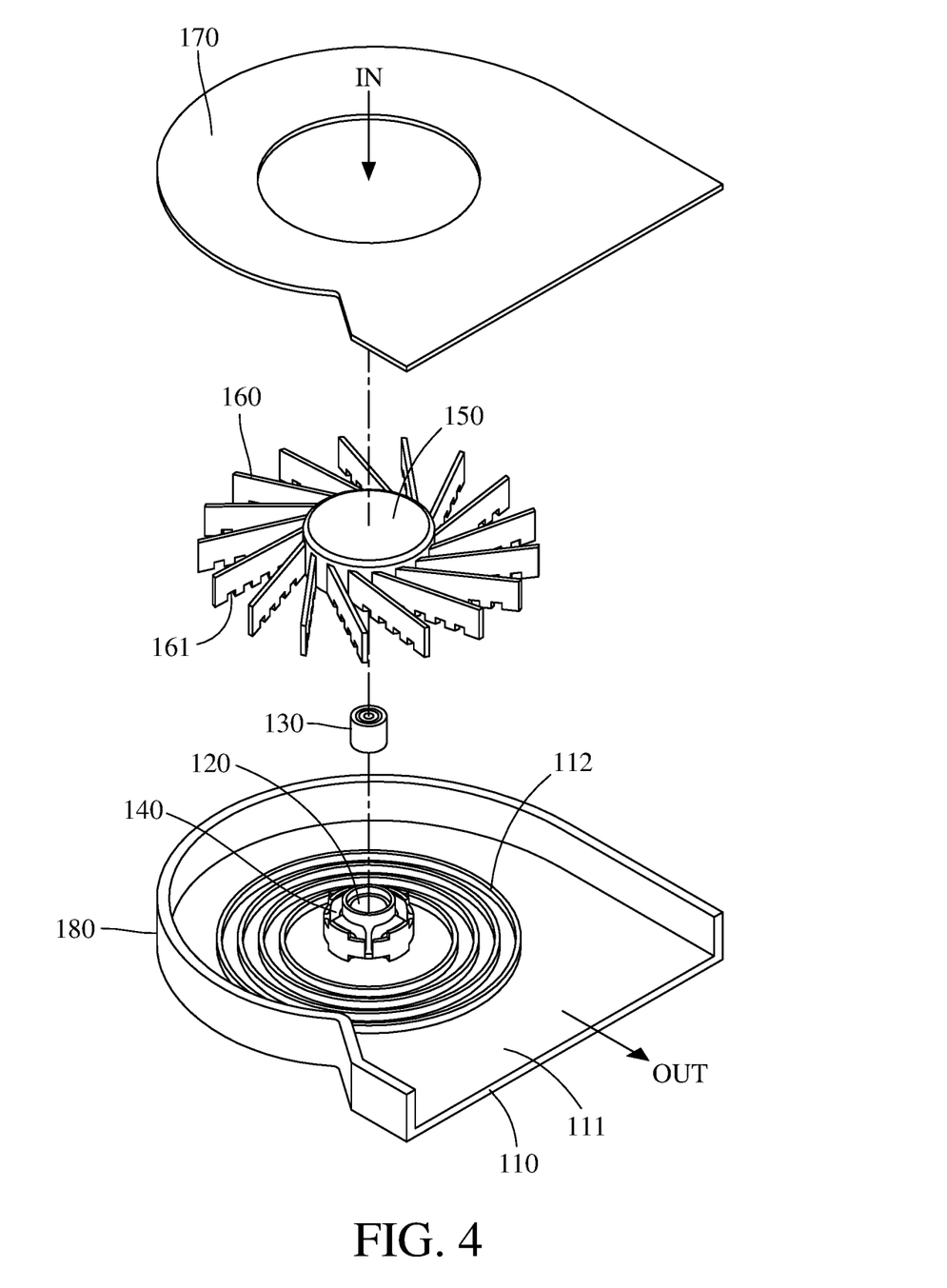
FIG. 4 is an exploded view of the cooling fan according to a second embodiment of the present disclosure.

Then, the cooling fan 200 according to the second embodiment of the present disclosure will be described below. Please refer to FIG. 4. FIG. 4 is an exploded view of the cooling fan according to the second embodiment of the present disclosure. The cooling fan 200 includes a base 110, a tube 120, a bearing 130, a stator 140, a rotor 150, a plurality of fan blades 160, a top board 170, and a wall 180, and the cooling fan 100 has an inlet IN and an outlet OUT. The cooling fan 200 in the second embodiment is similar to the cooling fan 100 in the first embodiment, and only differences between the cooling fan 200 in the second embodiment and the cooling fan 100 in the first embodiment will be described below.

In the first embodiment, each of the base protrusions 112 has four base passages 113, but the present disclosure is not limited thereto. In the cooling fan 200 of the second embodiment, the base protrusions 112 have no base passage 113. In other words, the base protrusion 112 is a continuous structure. The cooling fan 200 without base passage 113 also generates the flow perturbation, such as eddy or turbulence, through the first notches 161 of the fan blades 160 and the base protrusion 112 of the base 110 when the rotor 150 is rotating. The flow perturbation breaks the thermal boundary layer formed on the base 110 so that the heat transfer and the heat dissipating efficiency are improved.

Figure 5:
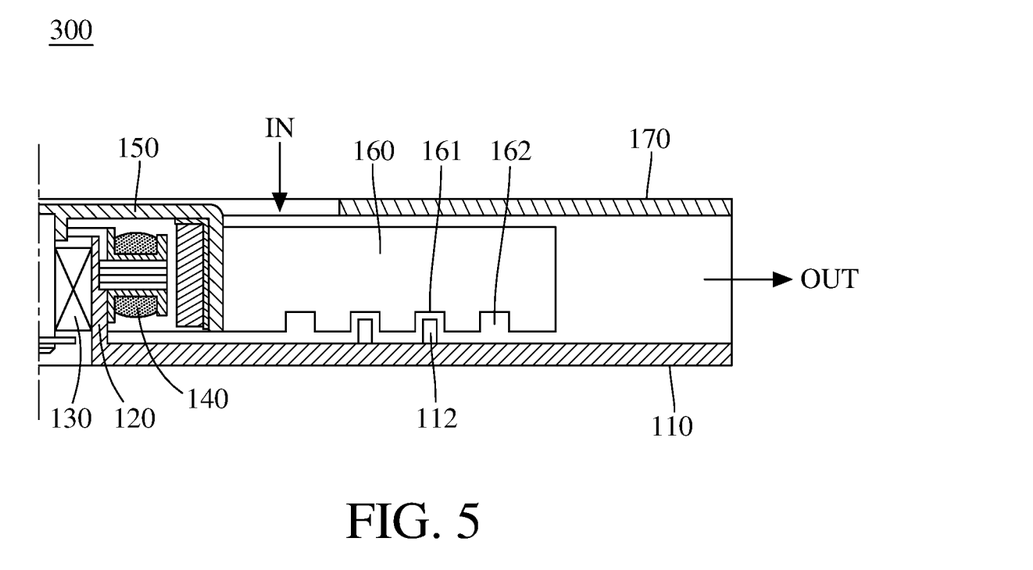
FIG. 5 is a cross-sectional view of the cooling fan according to a third embodiment of the present disclosure.

In the first embodiment, each of the base protrusions 112 passes through each of the first notches 161 on each of the fan blades 160 respectively, but the present disclosure is not limited thereto. Please refer to FIG. 5. FIG. 5 is a cross-sectional view of the cooling fan according to the third embodiment of the present disclosure. The cooling fan 300 in the third embodiment is similar to the cooling fan 100 in the first embodiment, and only differences between the cooling fan 300 in the third embodiment and the cooling fan 100 in the first embodiment will be described below. In the cooling fan 300 of the third embodiment, each of the fan blades 160 further has notches 162. The notches 162 and the first notches 161 are disposed on the same side of each of the fan blades 160. When the rotor 150 is rotating, the base protrusions 112 pass through the first notches 161 but do not pass through the notches 162. The notches 162 may be any number and anywhere as long as the structural strength requirement of the fan blades can be fulfilled. The notches 162 may further generate the flow perturbation, such as eddy or turbulence, to break the thermal boundary layer on the surface of the base 110 when the rotor 150 is rotating.

Figure 6:
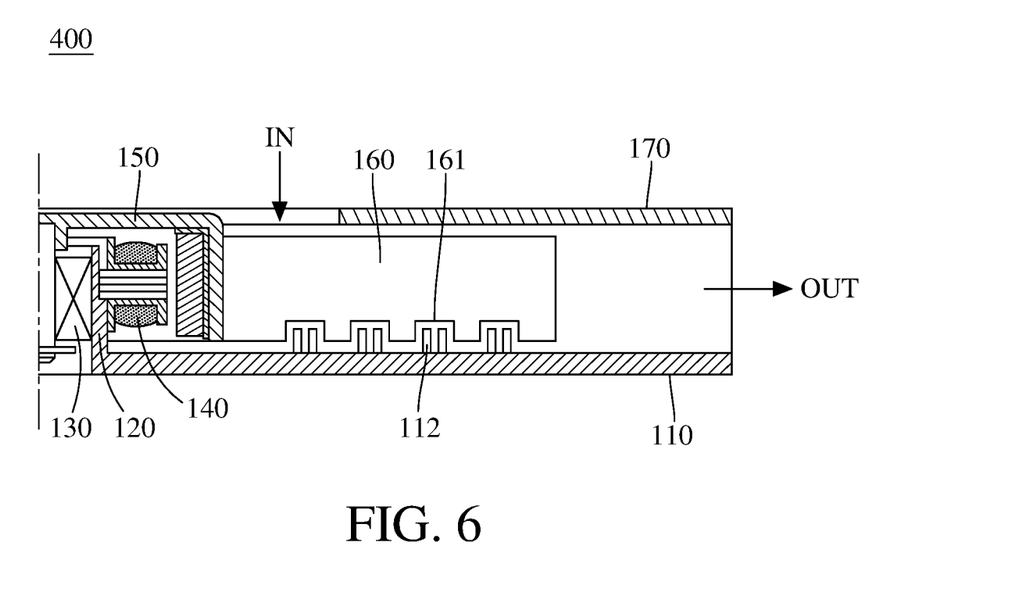
FIG. 6 is a cross-sectional view of the cooling fan according to a fourth embodiment of the present disclosure.

In the first embodiment, each of the base protrusions 112 passes through each of the first notches 161 on each of the fan blades 160, but the present disclosure is not limited thereto. Please refer to FIG. 6. FIG. 6 is a cross-sectional view of the cooling fan according to the fourth embodiment of the present disclosure. The cooling fan 400 in the fourth embodiment is similar to the cooling fan 100 in the first embodiment, and only differences between the cooling fan 400 in the fourth embodiment and the cooling fan 100 in the first embodiment will be described below. In the cooling fan 400 of the fourth embodiment, a plurality of the base protrusions 112, such as two base protrusions, pass through each of the first notches 161 on each of the fan blades 160 together when the rotor 150 is rotating. That is, each of the first notches 161 may accommodate the plurality of the base protrusions 112. The plurality of the base protrusions 112 may further generate the flow perturbation, such as eddy or turbulence, to break the thermal boundary layer on the surface of the base 110 when the rotor 150 is rotating.

Figure 7:
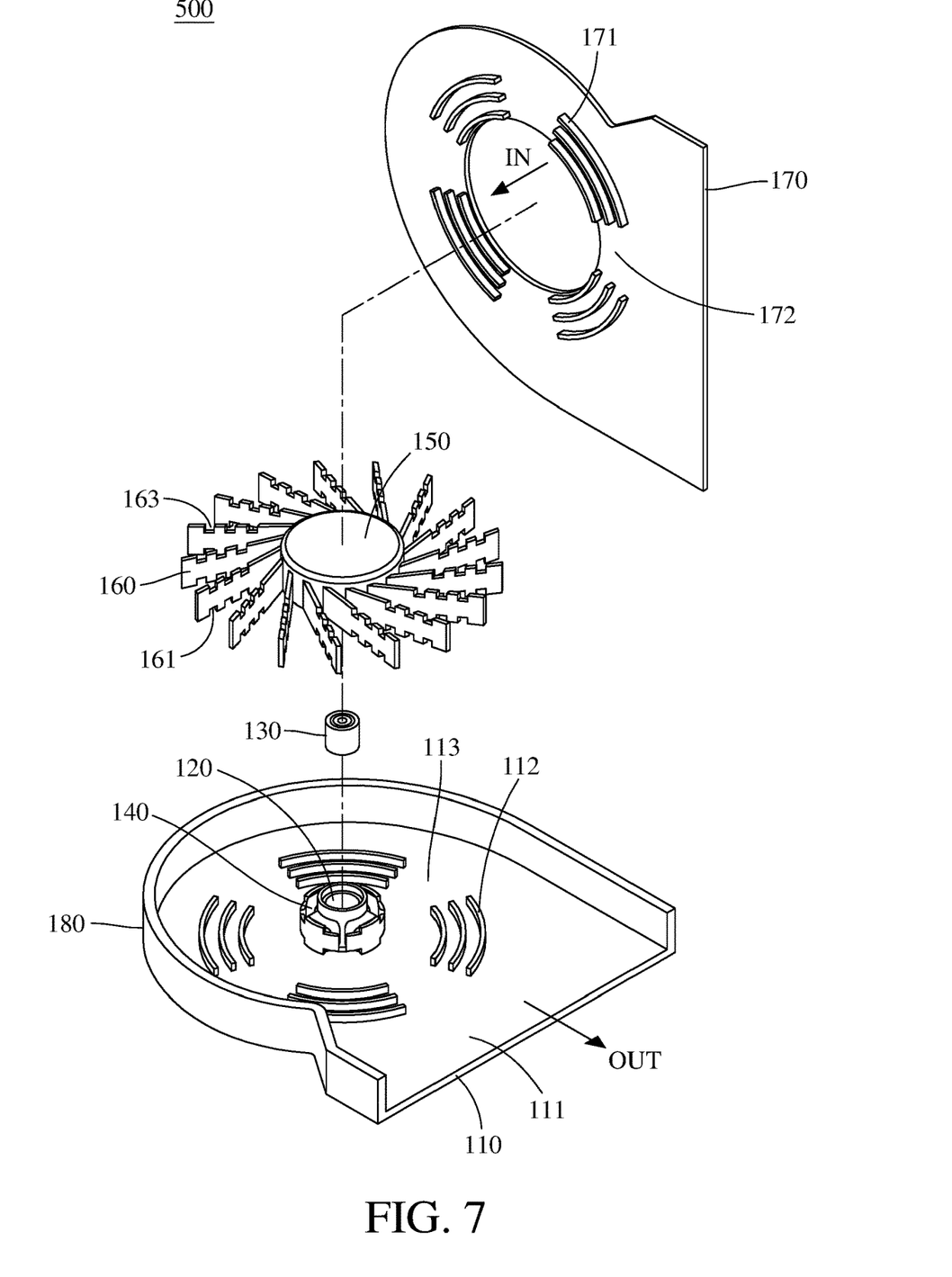
FIG. 7 is an exploded view of the cooling fan according to a fifth embodiment of the present disclosure.
Figure 8:
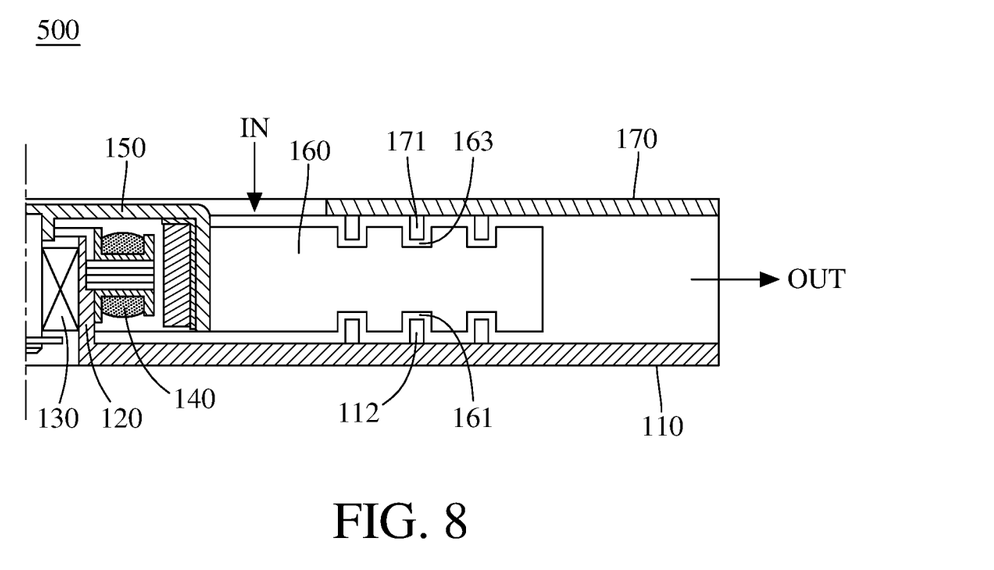
FIG. 8 is a cross-sectional view of the cooling fan according to the fifth embodiment of the present disclosure.

Then, the cooling fan 500 according to the fifth embodiment of the present disclosure will be described below. Please refer to FIG. 7 and FIG. 8. FIG. 7 is an exploded view of the cooling fan according to the fifth embodiment of the present disclosure. FIG. 8 is a cross-sectional view of the cooling fan according to the fifth embodiment of the present disclosure. The cooling fan 500 includes a base 110, a tube 120, a bearing 130, a stator 140, a rotor 150, a plurality of fan blades 160, a top board 170, and a wall 180, and the cooling fan 500 has an inlet IN and an outlet OUT. The cooling fan 500 in the fifth embodiment is similar to the cooling fan 100 in the first embodiment, and only differences between the cooling fan 500 in the fifth embodiment and the cooling fan 100 in the first embodiment will be described below.

In the fifth embodiment, the top board 170 has three top protrusions 171, and the top protrusions 171 surround the inlet IN. The top protrusions 171 have four top passages 172. In this embodiment, the number of the top protrusions 171 is three, and the number of the top passages 172 is four at each top protrusion 171, but the present disclosure is not limited thereto. In other embodiments, the top protrusions may have no top passage. The heat exchange area is increased by the top protrusions 171 so as to improve the heat exchange efficiency.

Each of the fan blades 160 has first notches 161 and second notches 163. The first notches 161 and the second notches 163 are located on the opposite sides of each of the fan blades 160 and aligned with each other. In this embodiment, the number of the first notches 161 and the number of the second notches 163 are three, respectively. When the rotor 150 is rotating, the base protrusions 112 pass through the first notches 161 of each of the fan blades 160, and the top protrusions 171 pass through the second notches 163 of each of the fan blades 160, respectively. Similarly, the parts between the first notches 161 of each of the fan blades 160 pass through the spaces between the base protrusions 112, and the parts between the second notches 163 of each of the fan blades 160 pass through the spaces between the top protrusions 171, respectively. Through the first notches 161, the second notches 163, the base protrusions 112 and the top protrusions 171, the flow perturbation, such as eddy or turbulence, can be generated to break the thermal boundary layer formed on the base 110 and the top board 170 when the rotor 150 is rotating. Therefore, the heat transfer and the heat dissipating efficiency of the cooling fan 500 are improved. In addition, the base passages 113 and the top passages 172 serve as exits for the air flow with higher temperature accumulated between the base protrusions 112 and the top protrusions 171 to flow out.

Figure 9:
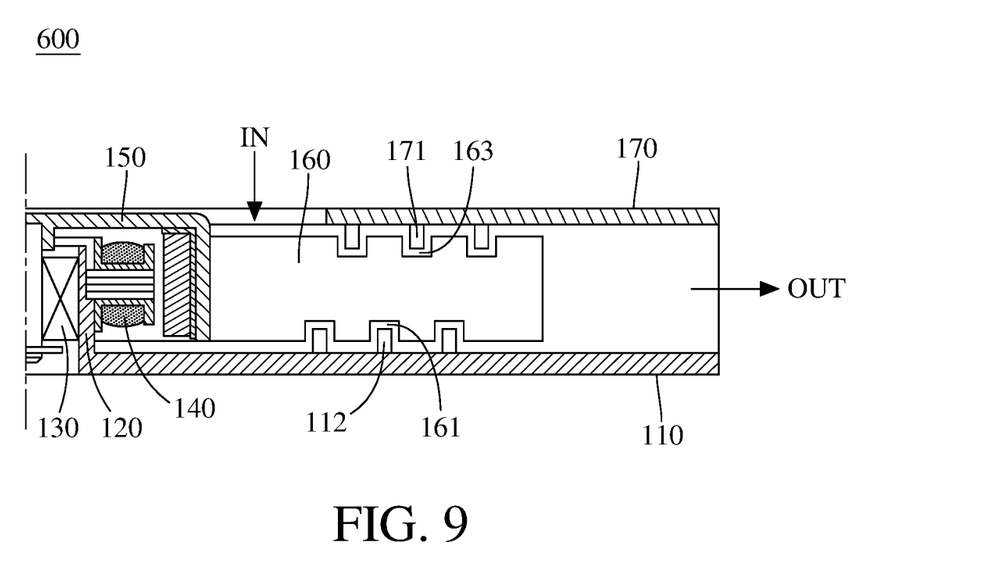
FIG. 9 is a cross-sectional view of the cooling fan according to a sixth embodiment of the present disclosure.

In the fifth embodiment, the first notches 161 and the second notches 163 are located on the opposite sides of each of the fan blades 160 and aligned with each other, but the present disclosure is not limited thereto. Please refer to FIG. 9. FIG. 9 is a cross-sectional view of the cooling fan according to the sixth embodiment of the present disclosure. The cooling fan 600 in the sixth embodiment is similar to the cooling fan 500 in the fifth embodiment, and only differences between the cooling fan 600 in the six embodiment and the cooling fan 500 in the fifth embodiment will be described below. In the cooling fan 600 of the sixth embodiment, the first notches 161 and the second notches 163 are on the opposite sides of each of the fan blades 160 and misaligned with each other. The location of the second notches 163 may be matched with the top protrusions 171 so that the top board 170 has more flexibility in the structural design. In other embodiments, the first notches 161 and the second notches 163 may be any number and anywhere as long as the structural strength requirement of the fan blades can be fulfilled.

According to one or more embodiment of this disclosure, the heat exchange area is increased by the protrusions on the base and the notches on the fan blades. The flow perturbation is generated to break the heat boundary layer repeatedly by the convex structures on the base and the notches on the fan blades when the cooling fan is working.

Though the embodiment according to the present disclosure is described above, the present disclosure is not limited thereto. Without departing from the spirit and scope of the present disclosure, any skilled person in the field can do some appropriate change in the shapes, structures, characteristics and spirits.

What is claimed is:

1. A cooling fan, comprising:
    a base having a base protrusion;
    a tube fixed to the base and surrounded by the base protrusion;
    a bearing disposed in the tube;
    a stator fixed to the base;
    a rotor pivoted to the bearing; and
    a plurality of fan blades connected to the rotor, each of the fan blades having a first notch, the base protrusion passing through the first notch of each of the fan blades when the rotor is rotating;
    wherein the number of the base protrusions is plural, and the base protrusions pass through the first notch of one of the fan blades together.

2. The cooling fan of claim 1, wherein the base protrusion has a first width, the first notch has a second width, and the first width is less than the second width.

3. The cooling fan of claim 1, wherein a cross-section of the base protrusion or the first notch is a rectangle.

4. The cooling fan of claim 1, wherein each of the fan blades further has a notch, and the notch and the first notch are disposed on the same side of each of the fan blades.

5. The cooling fan of claim 1, further comprising: a top board, a wall, an outlet, and an inlet, wherein the top board is opposite to the base, the wall is located between and connected to the top board and the base, the fan blades, the stator and the rotor are located between the base, the top board and the wall, the outlet is located on the wall, and the inlet is located on the top board or the base.

6. The cooling fan of claim 5, wherein the base protrusion has a base passage, and the base passage is located between the tube and the outlet.

7. The cooling fan of claim 5, wherein the top board has a top protrusion, the top protrusion has a top passage, each of the fan blades has a second notch, the top protrusion passes through the second notch of each of the fan blades when the rotor is rotating, and the first notch and the second notch are located on the opposite sides of each of the fan blades.

8. The cooling fan of claim 7, wherein the notch and the second notch are misaligned.

9. A heat dissipating module, comprising a cooling fan of claim 1, and a heat pipe connected to the base of the cooling fan.

* * * * *